(12) United States Patent
Borean et al.

(10) Patent No.: US 11,009,536 B2
(45) Date of Patent: May 18, 2021

(54) METHOD AND SYSTEM FOR ESTIMATING ENERGY GENERATION BASED ON SOLAR IRRADIANCE FORECASTING

(71) Applicant: Telecom Italia S.p.A., Milan (IT)

(72) Inventors: Claudio Borean, Turin (IT); Ennio Grasso, Turin (IT)

(73) Assignee: Telecom Italia S.p.A., Milan (IT)

( * ) Notice: Subject to any disclaimer, the term of this patent is extended or adjusted under 35 U.S.C. 154(b) by 239 days.

(21) Appl. No.: 16/339,240

(22) PCT Filed: Oct. 5, 2016

(86) PCT No.: PCT/EP2016/073768
§ 371 (c)(1),
(2) Date: Apr. 3, 2019

(87) PCT Pub. No.: WO2018/065045
PCT Pub. Date: Apr. 12, 2018

(65) Prior Publication Data
US 2020/0041550 A1   Feb. 6, 2020

(51) Int. Cl.
*G01R 21/133* (2006.01)
*G01W 1/10* (2006.01)
(Continued)

(52) U.S. Cl.
CPC ............. *G01R 21/133* (2013.01); *G01W 1/10* (2013.01); *G06N 3/0445* (2013.01); *G06N 3/08* (2013.01)

(58) Field of Classification Search
CPC ..... G01R 21/133; G01W 1/10; G06N 3/0445; G06N 3/08; G06N 3/0454;
(Continued)

(56) References Cited

U.S. PATENT DOCUMENTS 9,471,884 B2 * 10/2016 Hamann ................. G01W 1/10
10,230,241 B1 * 3/2019 Rule ....................... H02J 7/34
(Continued)

FOREIGN PATENT DOCUMENTS

EP   2608118 A1   6/2013

OTHER PUBLICATIONS

Jun. 15, 2017—(WO) Int'l Search Report and Written Opinion—App PCT/EP2016/073768.
(Continued)

*Primary Examiner* — Mohammad K Islam
(74) *Attorney, Agent, or Firm* — Banner & Witcoff, Ltd.

(57) ABSTRACT

Estimating energy generated by a solar system in a predetermined geographic area comprises, at each predetermined time instant: retrieving measured values of at least one weather parameter and of solar irradiance in the geographic area, the values related to a time slot before the predetermined time instant; performing auto-regression analysis of the measured values; estimating, based on the auto-regression analysis, a relationship between the at least one weather parameter and the solar irradiance; retrieving forecasted values of the at least one weather parameter in the geographic area, the forecasted values being forecasted for a second time slot after the predetermined time instant; performing regression analysis of the relationship between the at least one weather parameter and the solar irradiance of the forecasted values; forecasting solar irradiance in the second time slot based on the regression analysis, and estimating energy generated by the solar system in the second time slot.

14 Claims, 4 Drawing Sheets

(51) Int. Cl.
*G06N 3/04* (2006.01)
*G06N 3/08* (2006.01)

(58) Field of Classification Search
CPC ........... G05B 2219/25255; G05B 2219/25298; G05B 17/02
See application file for complete search history.

(56) References Cited

U.S. PATENT DOCUMENTS

| | | | | |
|---|---|---|---|---|
| 10,643,128 | B2* | 5/2020 | Chang | H02J 3/004 |
| 10,732,319 | B2* | 8/2020 | Feng | G06N 3/08 |
| 2014/0278108 | A1* | 9/2014 | Kerrigan | G01W 1/10 702/3 |
| 2014/0324352 | A1* | 10/2014 | Hamann | G01W 1/10 702/3 |
| 2015/0019034 | A1* | 1/2015 | Gonatas | H02S 10/00 700/291 |
| 2015/0088576 | A1* | 3/2015 | Steven | G06Q 50/06 705/7.22 |
| 2015/0134251 | A1* | 5/2015 | Bixel | G01W 1/10 702/3 |
| 2015/0276980 | A1* | 10/2015 | Menicucci | H02J 3/00 307/49 |
| 2015/0347922 | A1* | 12/2015 | Hamann | G01W 1/10 706/12 |
| 2016/0305678 | A1* | 10/2016 | Pavlovski | F24F 11/62 |
| 2018/0039891 | A1* | 2/2018 | Hamann | G01W 1/10 |
| 2018/0046924 | A1* | 2/2018 | Huang | H02J 3/004 |
| 2018/0203160 | A1* | 7/2018 | Dong | H02J 3/383 |
| 2018/0275314 | A1* | 9/2018 | Pavlovski | H02S 50/00 |
| 2019/0012598 | A1* | 1/2019 | Chang | G06Q 50/06 |
| 2019/0019080 | A1* | 1/2019 | Claessens | G05B 13/027 |
| 2019/0139059 | A1* | 5/2019 | Shiga | G06N 20/10 |
| 2019/0158011 | A1* | 5/2019 | West | H01L 31/042 |
| 2019/0254242 | A1* | 8/2019 | Allen | G06Q 10/06 |

OTHER PUBLICATIONS

F. Almonacid et al., "A methodology based on dynamic artificial neural network for short-term forecasting of the power output of a PV generator", Energy Conversion and Management, vol. 85, Sep. 2014 (Sep. 1, 2014), pp. 389-398, XP055381866.

Ricardo Marquez, et al., "Forecasting of global and direct solar irradiance using stochastic learning methods, ground experiments and the NWS database", Solar Energy, vol. 85, No. 5, Jan. 19, 2011 (Jan. 19, 2011), pp. 746-756, XP028191401.

Cho, K., et al., "Learning Phrase Representations using RNN Encoder-Decoder for Statistical Machine Translation", arXiv.org, Sep. 3, 2014 (Sep. 3, 2014), XP002771118.

S. Leva, et al., "Analysis and validation of 24 hours ahead neural network forecasting of photovoltaic output power", Mathematics and Computers in Simulation, vol. 131, Jul. 1, 2015 (Jul. 1, 2015), pp. 88-100, XP055381869.

Maimouna Diagne et al., "Review of solar irradiance forecasting methods and a proposition for small-scale insular grids", Renewable and Sustainable Energy Reviews, vol. 27, Nov. 1, 2013 (Nov. 1, 2013), pp. 65-76, XP055315298.

Gianfranco Chicco et al., "Error Assessment of Solar Irradiance Forecasts and AC Power from Energy Conversion Model in Grid-Connected Photovoltaic Systems", Energies 2016, 9, 8.

* cited by examiner

METHOD AND SYSTEM FOR ESTIMATING ENERGY GENERATION BASED ON SOLAR IRRADIANCE FORECASTING

BACKGROUND OF THE INVENTION

Field of the Invention

The present invention generally relates to a method and system for forecasting solar irradiance. More particularly, the present invention relates to a method and system for forecasting energy generated by solar systems, such as photovoltaic systems, based on solar irradiance forecasts.

Overview of the Related Art

The contribution of photovoltaic systems power production to the electric power supply is constantly increasing. Utility companies and transmission system operators have to deal with the fluctuating input from photovoltaic systems energy sources. This is a new challenge compared with power production from conventional power plants that can be adjusted to the expected load profiles.

An efficient use of the fluctuating energy output of photovoltaic systems requires reliable forecast information. Load patterns forecasted for the next 2 days provide the basis for scheduling of power plants and planning transactions in the electricity market in order to balance the supply and demand of energy and to assure reliable grid operation. This forecast information is used by utility companies, transmission system operators, energy service providers, energy traders, and independent power producers in their scheduling, dispatching and regulation of power.

The forecast of energy generated by a photovoltaic system is usually derived from solar irradiance forecasts.

Many solar irradiance forecasting models have been developed. These models can be divided into two main groups: statistical models and "Numerical Weather Prediction" (NWP) models.

Statistical models are based upon the analysis of historical data. They include time series auto-regressive models (ARMA families), "Artificial Neural Network" models, wavelet analysis models, etc. NWP models are based on the reproduction of physical information (hereinafter, NWP data) considering satellite data and sky images.

Hadja Maimouna Diagne, Mathieu David, Philippe Lauret, John Boland, Nicolas Schmutz, "Review of solar irradiance forecasting methods and a proposition for small-scale insular grids. Renewable and Sustainable Energy Reviews" Elsevier, 2013, 27, pp. 65-76, discloses a review of the methods used to forecast solar irradiance in order to facilitate selection of the appropriate forecast method according to needs, the current methods discussed in such a paper including statistical approaches and techniques based on cloud images, numerical weather prediction (NWP) models, and hybrid models.

Chicco, G.; Cocina, V.; Di Leo, P.; Spertino, F.; Massi Pavan, A. "*Error Assessment of Solar Irradiance Forecasts and AC Power from Energy Conversion Model in Grid-Connected Photovoltaic Systems*", Energies 2016, 9, 8, discloses considering from 1 to 3 days-ahead solar irradiance forecasts available during one year, with a few points for each day, and interpolating these forecasts to obtain more irradiance estimations per day. The estimated irradiance data are used to classify the sky conditions into clear, partly clouded or overcast sky. The results are compared with the outcomes of the same classification carried out with the irradiance measured by meteorological stations at two ground based photovoltaic sites.

SUMMARY OF INVENTION

The Applicant has recognized that none of the currently available solutions is satisfactory in determining reliable solar irradiance forecasts, and hence reliable forecasts of energy generated by a photovoltaic installation system (or, more generally, by a solar system installation).

Firstly, NWP data is not easily accessible.

Secondly, the Applicant has found that both the statistical and NWP models are based on the common approach of applying auto-regression on a high number of sequential data to predict future data, the underlying assumption of this approach being that the sequential data contain some intrinsic structure that the models can uncover for formulating the prediction.

However, the Applicant has understood that this approach cannot be adapted to solar irradiance forecasts, as solar irradiance forecasts are based on predictor variables that are not trustworthy.

In view of the above, the Applicant has faced the above mentioned issues, and has devised a robust forecasting method for determining reliable solar irradiance forecasts (and hence, for example, reliable forecasts of energy generated by a solar system such as a photovoltaic system) based on freely and easily accessible weather data (including both measured and forecasted values of selected weather parameters).

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect).

More specifically, an aspect of the present invention relates to a method for estimating energy generated by a solar system in a predetermined geographic area. The method comprises, at each predetermined time instant:

retrieving measured values of at least one weather parameter and of solar irradiance in respect of said predetermined geographic area, said measured values being related to a first time slot before said predetermined time instant;

performing an auto-regression analysis of the measured values;

estimating, based on said auto-regression analysis, a relationship between the at least one weather parameter and the solar irradiance;

retrieving forecasted values of said at least one weather parameter in respect of said predetermined geographic area, said forecasted values being forecasted for a second time slot after said predetermined time instant;

performing a regression analysis of said relationship between the at least one weather parameter and the solar irradiance and of said forecasted values;

forecasting a solar irradiance in said second time slot based on said regression analysis, and estimating energy generated by the solar system in said second time slot according to the forecasted solar irradiance and at least one solar system parameter.

According to an embodiment of the present invention, said performing and said estimating comprise providing the measured values of at least one weather parameter and of solar irradiance to an encoder network of a sequence-tosequence neural network, thereby obtaining encoded measured values indicative of said relationship between the at least one weather parameter and the solar irradiance. Preferably, said forecasting comprises providing said encoded measured values and said forecasted values to a decoder network of the sequence-to-sequence neural network.

According to an embodiment of the present invention, said performing and said estimating comprise:
- providing the measured values of at least one weather parameter and of solar irradiance to an encoder network of a sequence-to-sequence neural network, thereby obtaining encoded measured values indicative of said relationship between the at least one weather parameter and the solar irradiance, and
- providing the encoded measured values to an attention network thereby obtaining a weighted combination of the encoded measured values.

Additionally or alternatively, said performing and said forecasting comprise providing said weighted combination of the encoded measured values and said forecasted values to a decoder network of the sequence-to-sequence neural network.

According to an embodiment of the present invention, the measured values comprise, for each weather parameter and for the solar irradiance, a plurality of measured values each one related to a respective measure time within said first time slot. Preferably, said retrieving comprises retrieving the measured values and the associated measure times, and more preferably said providing the measured values of the at least one weather parameter and of solar irradiance to an encoder network comprises providing the measured values and the associated measure times to the encoder network.

According to an embodiment of the present invention, at least one of said at least one weather parameter is a categorical variable, each weather parameter other than a categorical variable being a continuous variable. Said providing the measured values of the at least one weather parameter and of solar irradiance to an encoder network comprises:
- mapping the measured values of each categorical variable to vectors of numbers in a continuous space, and
- concatenating the mapped measured values with the measured values of each continuous variable thereby obtaining concatenated measured values of each weather parameter,
- providing said concatenated measured values to the encoder network together with the measured values of solar irradiance.

According to an embodiment of the present invention, said continuous space is a Euclidean space.

According to an embodiment of the present invention, said encoder network is a bi-directional recurrent neural network.

According to an embodiment of the present invention, said encoder network is a "Long Short Term Memory" or a "Gated Recurrent Unit" recurrent neural network.

According to an embodiment of the present invention, the attention network comprises a feed-forward network adapted to provide said weighted combination of the encoded measured values according to a current hidden state of the decoder network.

According to an embodiment of the present invention, the decoder network is a unidirectional decoder network.

According to an embodiment of the present invention, the decoder network is a "Long Short Term Memory" or a "Gated Recurrent Unit" recurrent neural network.

According to an embodiment of the present invention, said at least one weather parameter comprises at least one among:
- textual general weather information;
- temperature;
- humidity;
- amount of sky occluded by clouds.

Another aspect of the present invention relates to a system for estimating energy generated by a solar system in a predetermined geographic area. The system comprises:
- a first module configured to retrieve, at a predetermined time instant, measured values of at least one weather parameter and of solar irradiance in respect of said predetermined geographic area, said measured values being related to a first time slot before said predetermined time instant, and to retrieve forecasted values of said at least one weather parameter in respect of said predetermined geographic area, said forecasted values being forecasted for a second time slot after said predetermined time instant;
- a second module configured to estimate, based on an auto-regression analysis of the measured values, a relationship between the at least one weather parameter and the solar irradiance;
- a third module configured to forecast a solar irradiance in said second time slot based on a regression analysis of said relationship between the at least one weather parameter and the solar irradiance and of said forecasted values, and
- a fourth module configured to estimate energy generated by the solar system in said second time slot according to the forecasted solar irradiance and at least one solar system parameter.

According to an embodiment of the present invention, said second module comprises an encoder network of a sequence-to-sequence neural network, said encoder network preferably providing encoded measured values indicative of said relationship between the at least one weather parameter and the solar irradiance. Advantageously, the third module comprises a decoder network of the sequence-to-sequence neural network, the decoder network preferably providing solar irradiance forecasting according to said encoded measured values and said forecasted values.

BRIEF DESCRIPTION OF THE ANNEXED DRAWINGS

These and other features and advantages of the present invention will be made apparent by the following description of some exemplary and non-limitative embodiments thereof; for its better intelligibility, the following description should be read making reference to the attached drawings, wherein.

DETAILED DESCRIPTION OF PREFERRED EMBODIMENTS OF THE INVENTION

Figure 1:
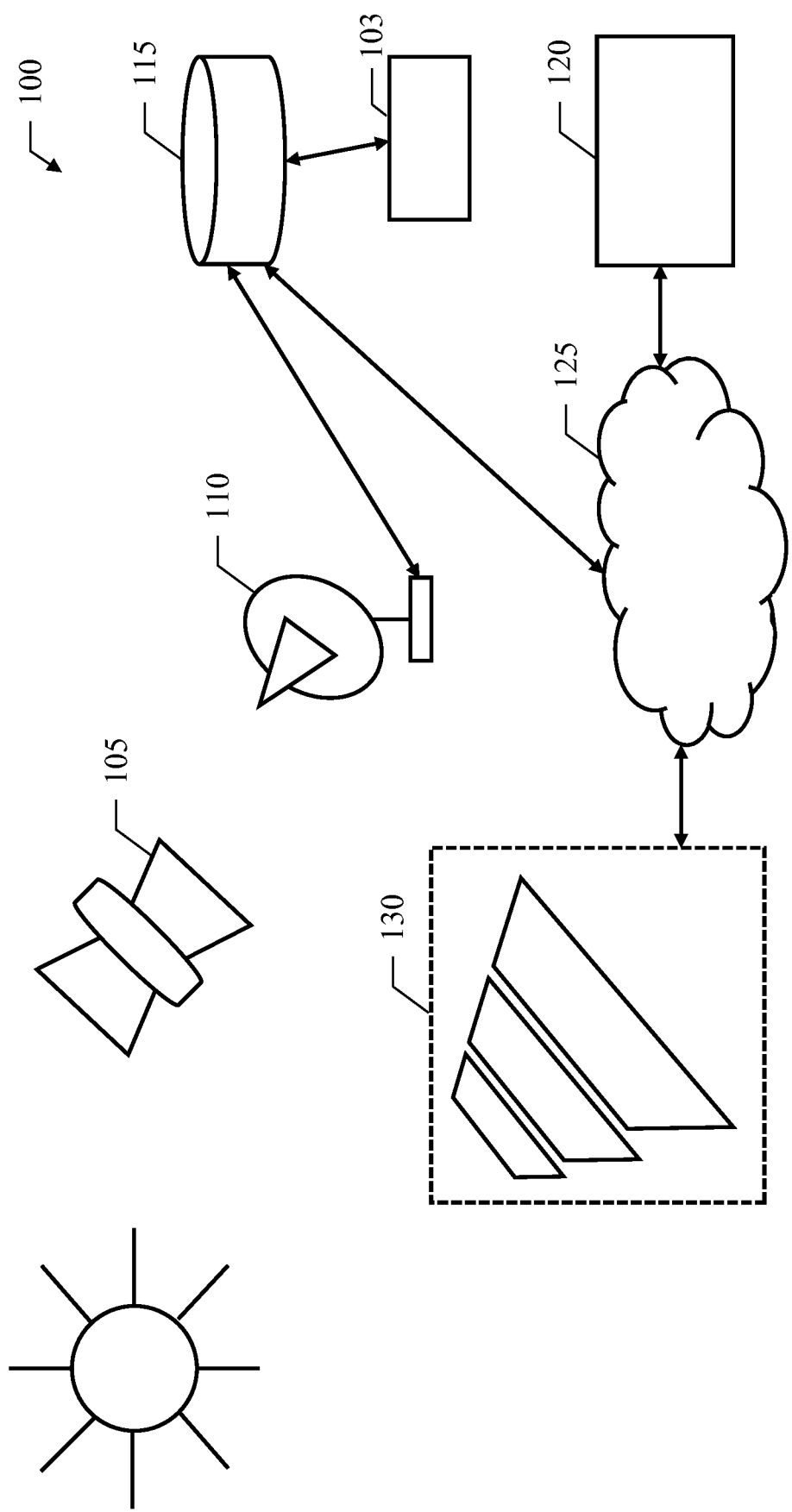
FIG. 1 illustrates a system according to an embodiment of the present invention.

With reference to the drawings, FIG. 1 illustrates a system 100 according to an embodiment of the present invention.

The system 100 preferably comprises a satellite 105 (for example, a weather satellite, i.e. a polar orbiting or geostationary satellite that is primarily used to monitor the weather and climate of the Earth) and a satellite transmitter/receiver (transceiver) 110. Additionally (as herein exemplary illustrated) or alternatively to the satellite 105, the system 100 may comprise a terrestrial weather station, such as the terrestrial weather station 103.

The system 100 preferably comprises a weather data system 115 connected or connectable to the satellite transceiver 110 and/or to the terrestrial weather station 103. Advantageously, the weather data system 115 offers a weather web service providing free web "Application Programming Interfaces" (APIs) with basic weather forecasts for 1-3 days ahead. The system 100 also comprises an apparatus 120 connected or connectable to the weather data system 115 via a network 125 (including, for example, any combination of public and private networks, wired and wireless networks, and/or any suitable network, e.g., the Internet).

The apparatus 120 is generally configured to forecast solar irradiance in a predetermined geographical area, and to estimate energy generation by a solar system 130 according to the forecasted solar irradiance and to one or more parameters of the solar system 130. As exemplary assumed and illustrated, the solar system 130 may comprise a photovoltaic system for generation of electric energy (e.g., including one or more solar panels for absorbing and converting sunlight into electric energy). Additionally or alternatively, the solar system 130 may comprise a solar thermal collector for generation of thermal energy (e.g., for residential or industrial water heating).

In the exemplary considered application wherein the solar system 130 is a photovoltaic system, the parameters of the solar system 130 may for example comprise efficiency, exposure and size of the photovoltaic system), and the energy generation estimated based on the solar irradiance forecast and on the parameters of the photovoltaic system is for example used for coping with forecasted energy shortfall (e.g., by preventively generating additional energy and/or by purchasing additional energy from third parties).

According to the exemplary considered scenario wherein the solar irradiance forecast is used to estimate the energy generated by a solar system, the apparatus 120 is also connected or connectable to the solar system 130 (preferably, as illustrated, via the network 125), e.g. for receiving the parameters of the solar system 130 and/or for providing the estimated energy generation. In alternative embodiments of the present invention, the apparatus 120, or one or more components or modules thereof, may be integrated in a processing unit, not shown, of the solar system 130.

Preferably, the satellite 105 periodically provides satellite data to the weather data system 115 via the satellite transceiver 110, and the weather data system 115 processes the satellite data for one or more predetermined geographical areas and stores corresponding weather data. For the purposes of the present invention, the weather data stored in the weather data system 115 comprises, but is not limited to, measured and forecasted values of weather parameters (the weather parameters comprising, for example, sunrise-time, sunset-time, nearest storm-distance, humidity, dew-point, temperature, feel-like-temperature, atmospheric pressure, general weather information, and cloud-cover), and measured values of solar irradiance (the forecasted values of solar irradiance, and hence the estimate of the energy generated by the solar system 130, being instead the aim/purpose/target of the apparatus 120).

Figure 2:
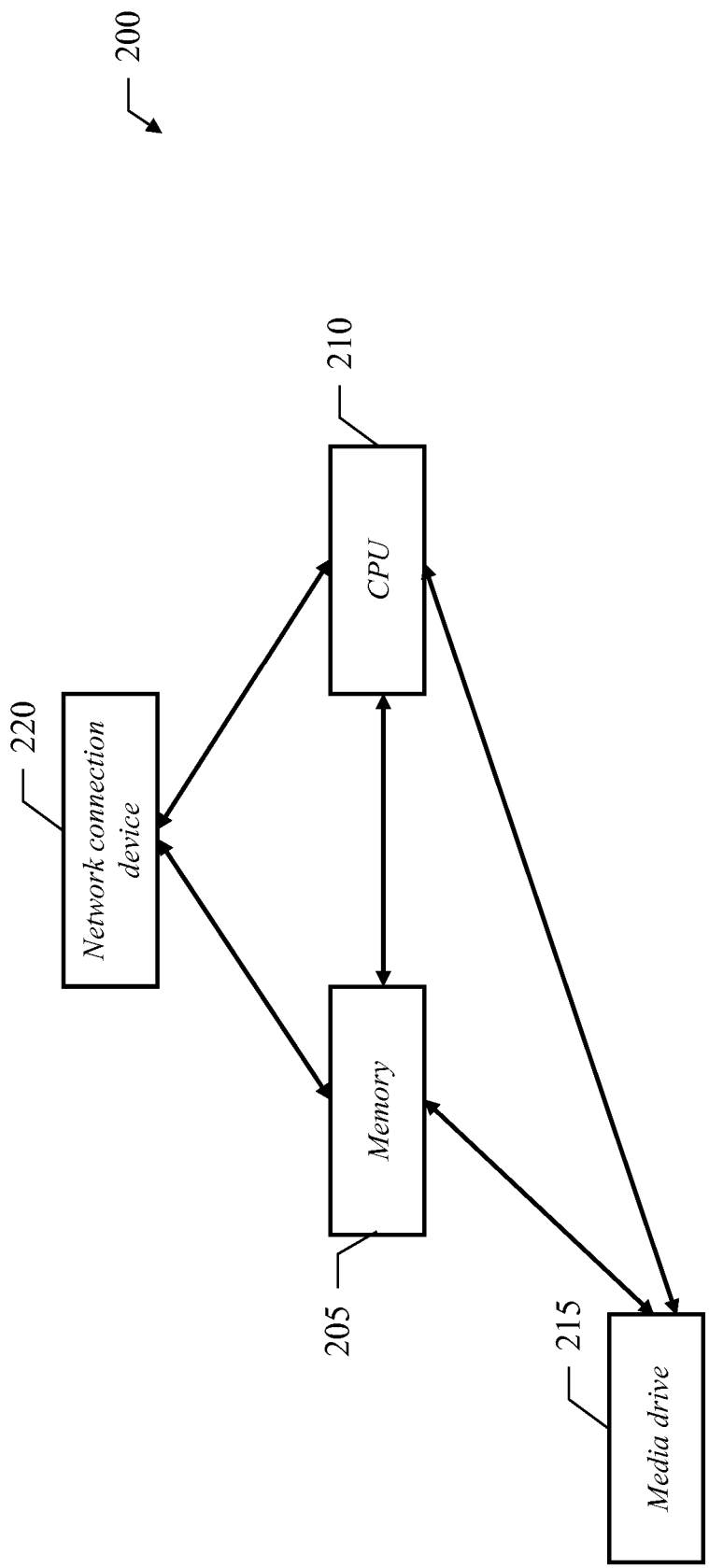
FIG. 2 illustrates a block diagram of a computing system that may be employed in said system according to an embodiment of the present invention.

The apparatus 120 may be a computing system configured or configurable to perform a forecasting procedure (discussed in the following). A block diagram of an example of such a computing system is illustrated in FIG. 2 (and denoted by the number reference 200).

The computing system 200 preferably comprises a memory 205. The memory 205 is preferably adapted to store software code means for implementing the forecasting procedure, the weather data from weather data system 115 and/or the parameters from the solar system 130.

The computing system 200 preferably comprises one or more central processing units (CPU) 210 for executing software, and a computer-readable media drive 215 for reading information or installing software from tangible computer-readable storage media, such as a floppy disk, a CD-ROM, a DVD, a USB flash drive, and/or other tangible computer-readable storage media.

The computing system 200 also comprises a network connection device 220 for connecting to the network 125, and hence to the weather data system 115 and to the solar system 130.

Figure 3:
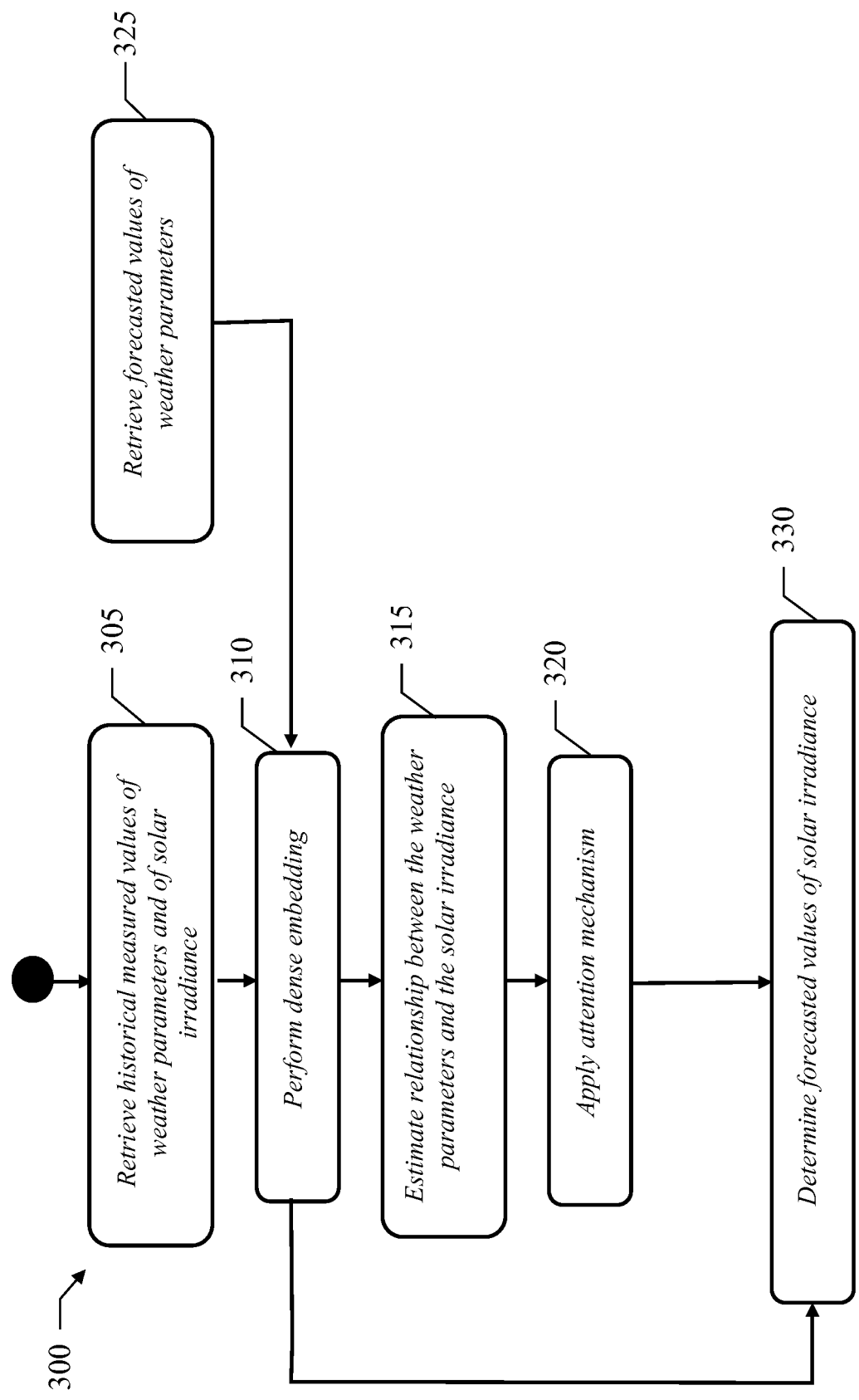
FIG. 3 is a flow diagram of a forecasting procedure according to an embodiment of the present invention.

With reference now to FIG. 3, it is a flow diagram of a forecasting procedure 300 for forecasting solar irradiance according to an embodiment of the present invention. As mentioned above, the solar irradiance forecast output by the forecasting procedure 300 is preferably used by the apparatus 120 (e.g., by exploiting CPU 210 functionalities and/or processing capabilities) to estimate the energy (for example, the electric energy) generated by a solar system (for example, a photovoltaic system).

Broadly speaking, at each predetermined time instant t and for a predetermined geographic area, the forecasting procedure 300 is arranged for retrieving measured values of selected weather parameters and of solar irradiance (the measured values, hereinafter referred to as historical measured values, being related to a first time slot, hereinafter referred to as past time slot, before said predetermined time instant t, the measured values being thus past measured values), and forecasted values of the selected weather parameters (the forecasted values being forecasted for a second time slot, hereinafter referred to as future time slot, after said predetermined time instant t), thereafter the forecasting procedure 300 is arranged for estimating, based on an auto-regression analysis of the measured values, a relationship between the selected weather parameters and the solar irradiance (i.e., a weather model for the solar irradiance), and for forecasting the solar irradiance in the predetermined geographic area based on a regression analysis of the relationship between the selected weather parameters and the solar irradiance, and of the forecasted values. As better discussed in the following, said estimating based on a regression analysis, and said forecasting based on an auto-regression analysis are preferably achieved by means of a neural network.

The forecasting procedure 300 will be discussed in more detailed in the following with joint reference to FIG. 4, the latter schematically illustrating, in terms of functional modules, a neutral network 400 according to an embodiment of the present invention—in this figure, the historical measured values of the weather parameters and of solar irradiance, the forecasted measured values of the weather parameters and the forecasted values of solar irradiance are denoted by the letters H, F and P, respectively.

It is preliminary pointed out that the use of the term "module" is herein intended to emphasize functional (rather than implementation) aspects thereof. Indeed, without losing generality, the modules may be implemented by software (in which case, the resulting algorithm would be performed by proper software code means included in a computer program, when the program is run on a computing system, such as the computing system 200), hardware, and/or a combination thereof. Moreover, the modules may also reflect, at least conceptually, the physical structure of the apparatus 120 (or of at least portions thereof, such as the CPU 210). However, the modules may have, by the physical viewpoint, distributed nature, it being understood that, by the logical viewpoint, they are all part of the system, wherever (and in whichever way) their physical implementation takes place. Moreover, a different functionality splitting between the various modules may be envisaged.

The forecasting procedure 300 starts by retrieving historical measured values of selected weather parameters and of the solar irradiance (step 305).

According to an embodiment of the present invention, the historical measured values of each selected weather parameter are retrieved (by the apparatus 120) by accessing the weather data system 115 (such as Weather Underground, OpenWeatherMap, or Dark Sky), or more thereof, via the network 125.

Preferably, the selected weather parameters comprise a subset of the weather parameters actually handled by the accessed weather data system 115.

More preferably, the selected weather parameters comprise, among the weather parameters actually handled by the accessed weather data system 115, those weather parameters being relevant for (i.e. having a certain relationship with, or affecting to a certain extent) the solar irradiance forecast— just as an example, the nearest storm-distance is a weather parameter having a marginal effect on solar irradiance forecast.

Even more preferably, the selected weather parameters comprise, among the weather parameters actually handled by the accessed weather data system 115, those relevant weather parameters having a low (or relatively low) mutual correlation—indeed, the weather parameters having a high (or relatively high) mutual correlation (see, for example, the high mutual correlation between humidity and dew-point, or between temperature and feel-like-temperature) are substantially equivalent to each other, so that each weather parameter would provide no additional useful information with respect to the respective correlated relevant weather parameter(s).

Still more preferably, the selected weather parameters comprise, among the weather parameters actually handled by the accessed weather data system 115, those relevant weather parameters whose historical measured values are available over time with reasonable continuity—just as an example, the atmospheric pressure could be a relevant weather parameter for solar irradiance forecast, however the usual sparse availability of measured values of atmospheric pressure makes it unreliable to this purpose.

According to an embodiment of the present invention, the selected weather parameters comprise at least one among:

- summary, for example a textual general weather information (such as, "overcast", "clear and windy", or "partially clouded");
- temperature, for example a numerical value indicative of the temperature;
- humidity, for example a numerical value indicative of the relative humidity (this numerical value being for example between 0 and 1);
- cloud-cover, for example a numerical value indicative of a percentage of sky occluded by clouds (this numerical value being for example between 0 and 1).

Additionally or alternatively to "summary", "temperature", "humidity" or "cloud-cover" weather parameter, other weather parameters can be considered (e.g., sunrise time, sunset time, dew-point, and feel-like-temperature), and/or environmental parameters can be considered (such as city lights, fires, pollution), the parameters to be considered depending on the specific application and being not limiting for the present invention.

Preferably, the historical measured values of solar irradiance comprise numerical values indicative of the power per unit area received from the sun in the form of electromagnetic radiation in the wavelength range of a proper measuring instrument. According to an embodiment of the present invention, the measuring instrument (not shown) is installed in close proximity to the solar system 130 for which energy forecast is required, and the measured values of solar irradiance may be provided through the network 125 either to the weather data system 115 (and, hence, to the apparatus 120 together to the measured values of the selected weather parameters when the apparatus 120 accesses the weather data system 115), or directly to the apparatus 120.

In the following, the historical measured values will denote both the historical measured values of the selected weather parameters and the historical measured values of solar irradiance.

Preferably, the retrieved historical measured values comprise, for each selected weather parameter and for the solar irradiance, a plurality of measured values each one related to a respective measure time within the past time slot (the measures times being preferably retrieved by the apparatus 120 together with the associated historical measured values).

According to an embodiment of the present invention, each measure time comprises a time of the day, and the day of the year. Advantageously, the time of the day is one of the 24 daily hours: indeed, the "hour" is the usual the time interval with which both measured and forecasted values of the weather parameters and the measured values of the solar irradiance are typically updated at the weather data system 115, and any time interval smaller than one hour would provide no additional useful contribution (due to the variance in weather forecasts).

Preferably, the measure time is described according to UNIX time representation, wherein the instants in time are defined as the number of seconds that have elapsed since 00:00:00 Coordinated Universal Time (UTC), Thursday, 1 Jan. 1970. Other than being compact, the UNIX time representation is independent of time zones, so that no adjustments are required in the case of weather data system 115 and apparatus 120 located at different time zones.

As mentioned above, the retrieved historical measured values comprise a plurality of measured values each one related to a respective measure time within the past time slot. The number of measure times may for example range from 24 to 100 (the number of measure times being for example 72, thus resulting in historical measured values at each hour of past three days from the predetermined time instant t). Anyway, without losing generality, a different number of measure times may be considered, and/or a different granularity may be envisaged (for example, a granularity of the fraction or of the multiple of an hour may be envisaged).

Figure 4:
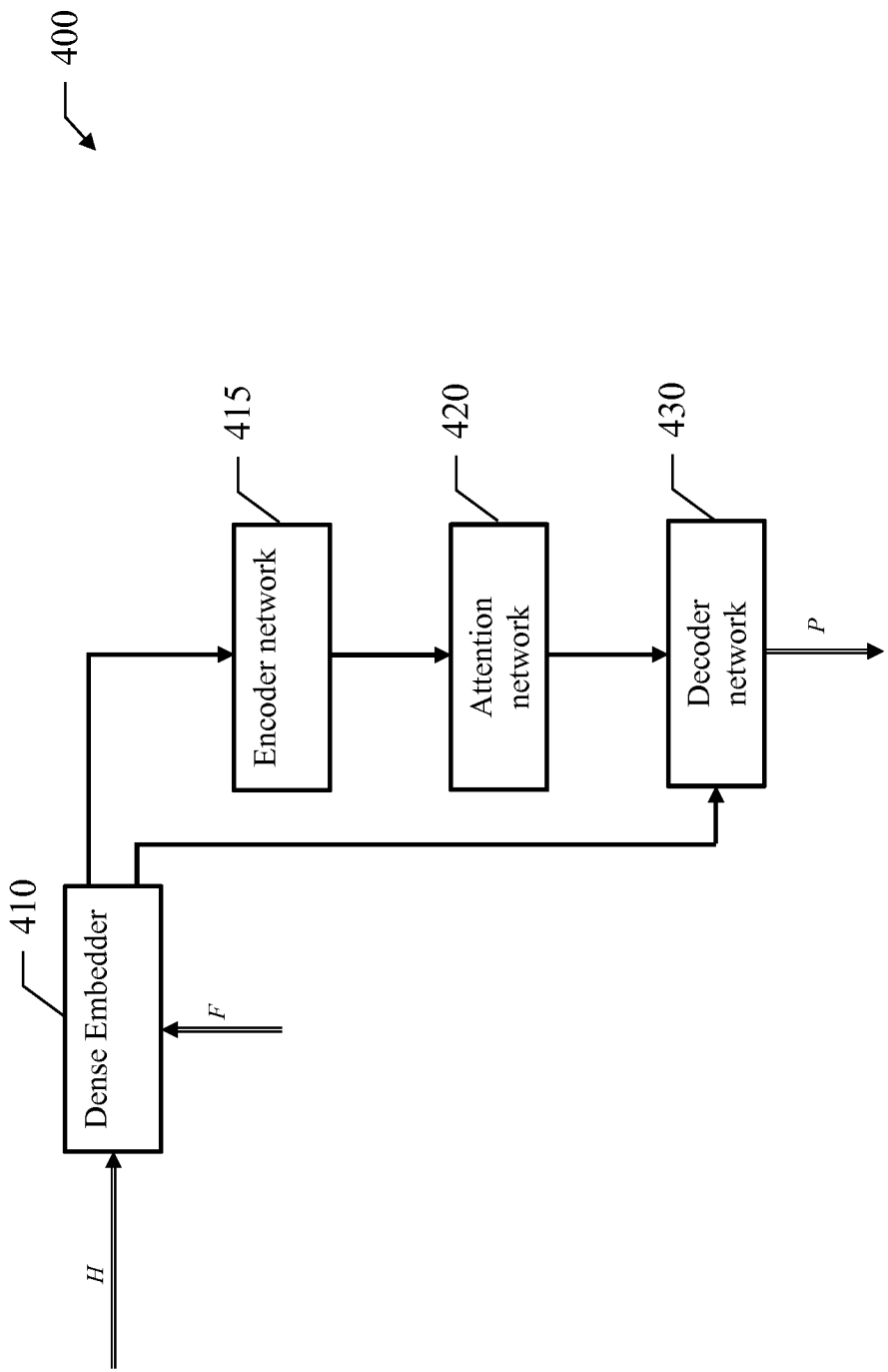
FIG. 4 illustrates, in terms of functional modules, a neural network implementing the forecasting procedure according to an embodiment of the present invention.

Back to FIG. 3, after the historical measured values of the selected weather parameters and of the solar irradiance have been retrieved, the forecasting procedure 300 preferably carries out a dense embedding (step 310) of the historical measured values having categorical nature—see the dense embedder 410 in FIG. 4, the dense embedder being for example part of the neural network 400, as herein assumed, or being external thereto.

For the purposes of the present invention, categorical values means discrete (i.e., not continuous) values.

In the example at issue wherein the "temperature" weather parameter comprises a numerical value indicative of the temperature (potentially ranging over an unlimited range of values), and the "humidity" and "cloud-cover" weather parameters are numerical values potentially taking any value between 0 and 1, the measured values of the "temperature", "humidity" and "cloud-cover" weather parameters may be regarded as having continuous nature (and the "temperature", "humidity" and "cloud-cover" weather parameters may be regarded as continuous variables).

On the contrary, in the example at issue wherein the "summary" weather parameter comprises one among predefined textual general weather information, the "summary" weather parameter may be regarded as having categorical or discrete nature (and, hence, it may be regarded as a categorical or discrete variable).

As far as measure time is concerned, it is a continuous value, but in the context of the present invention it is made discrete in bins of granularity of the hour. For this reason, according to the preferred embodiment herein discussed (in which the hour of the day takes one of 24 possible values, and the day of the year takes one of the 366 possible values), the measure time is treated or processed as a categorical or discrete variable.

Broadly speaking, a dense embedder is a neural network layer that learns how to embed (transform) categorical values into continuous values where the (Euclidean or cosine) distance corresponds to the "actual" learned semantic distance between the categorical variables.

According to dense embedding:

for each categorical variable (i.e., the "summary" weather parameter and the measure time in the example at issue), the respective sparse, discrete values are mapped to vectors of numbers (e.g., real numbers) in a continuous space (for example, a Euclidean space), and preferably, the dense, continuous outputs of the categorical variables so mapped are concatenated with the historical measured values of the continuous variables (i.e., the "temperature", "humidity" and "cloud-cover" weather parameters in the example at issue) thereby obtaining a dense, continuous representation of all historical measured values (of each weather parameter) at each measure time.

The dimension of these transformed (i.e., mapped and concatenated) values is a hyper parameter properly chosen by the practitioner. Typically, it should reflect the complexity of the categorical values being embedded. Without losing generality, all the three categorical variables (summary-text, hour-of-day, day-of-year) are embedded into n-dimensional spaces (for example, 6-dimensional spaces). According to an embodiment of the present invention, the number n of dimensions of each n-dimensional space may be initially estimated based on the possible values that the considered categorical variable can take (e.g., based on the square root or the binary logarithm of the possible values), and then refined based on proper techniques (such as cross-validation techniques).

Therefore, thanks to dense embedding, 6 coherent continuous variables, i.e. 6 variables whose measured values are coherent and continuous with each other, are obtained. This allows optimizing the following training phase (discussed below) with efficient application of "Stochastic Gradient Descent" (SGD) algorithms and/or variants thereof (including, for example, "Momentum", "AdaGrad", "RMSprop", "Nesterov", and "Adam" algorithms)—in any case, dense embedding may also be omitted in alternative embodiments of the present invention (for example, when no categorical variables are used).

Preferably, the dense, continuous representation of the historical measured values at each measure time provided by the dense embedder 410 is in the form of a 3-dimensional tensor (hereinafter, embedded tensor) whose shape is:

mini-batch size, i.e. the size of the mini-batch of data, namely the samples over which to make a single step of "Stochastic Gradient Descent" (SGD) training;

sequence length, i.e. the sequence length of data for the following processing (preferably by "Recurrent Neural Network", as discussed below). Preferably, the sequence length is chosen according to a trade-off between the computational cost of longer sequences and their increased information—the longer the sequence lengths, the more the information gain of events much further in the past become negligible. In the example at issue wherein 72 historical measured values are retrieved for each weather parameter and for the solar irradiance (i.e., corresponding to 72 measure times located at each hour of three past days from the predetermined time instant t), the sequence length is 72; and the number of the independent variables (in the example at issue, 22 variables are provided, namely: temperature, humidity, cloud-cover, solar irradiance, plus the outputs of the dense embedder (i.e., 6 times 3=18).

Back to the figures, after the historical measured values (preferably, together with the associated measure times) have been retrieved, and possibly after dense embedding of the historical measured values and of the associated measure times), the forecasting procedure 300 estimates, based on an auto-regression analysis (i.e., a regression analysis applied to identify autocorrelation of a time series data), a relationship between the weather parameters and the solar irradiance (step 315), retrieves the forecasted values of the weather parameters (step 325), and forecasts the solar irradiance based on a regression analysis of this relationship and of the forecasted values of the weather parameters (step 330).

According to an embodiment of the present invention, said estimating based on an auto-regression analysis, and said forecasting based on a regression analysis are preferably achieved by means of a "Sequence-to-Sequence" (Seq2Seq) network. Broadly speaking, a Seq2Seq network is an architecture of neural network including an encoder network followed by a decoder network (referred to as RNN encoder-decoder)—see Cho et al., "Learning Phrase Representations using RNN Encoder-Decoder for Statistical Machine Translation" (https://arxiv.org/abs/1406.1078). Both encoder and decoder networks are "Recurrent Neural Networks", hereinafter RNN networks. An RNN network is a class of artificial neural networks where connections between units form a directed cycle. This creates an internal (hidden) state of the RNN network which allows it to exhibit dynamic temporal behavior. RNN networks can use their internal memory to process arbitrary sequences of inputs.

Broadly speaking, the encoder network maps a variable-length source sequence to a fixed-length vector, and the decoder network maps the vector representation back to a variable-length target sequence. Encoder and decoder networks are jointly trained (i.e., they are trained end-to-end, meaning that there is not separate pre-training of the encoder and decoder networks with their later combination, but instead that the training signal is propagated directly from the loss function to all the parameters of the neural network 400), so as to maximize the conditional probability of the target sequence given a source sequence.

In the basic RNN encoder-decoder, the encoder network processes its input sequence, and the final hidden state of the encoder network represents the "compressed" information of the whole sequence—this is a natural feature of RNN networks, wherein their hidden state depends on the current input and the previous hidden state (in other words, RNN networks are auto-regressive). Since the final hidden state of the encoder network is a compressed representation of the whole input sequence, such state is used to initialize the hidden state of the decoder network, in this way the decoder network is conditioned on its own input and the encoder network input by proxy of the hidden state.

Back to the figures, the forecasting procedure 300 estimates, based on a regression analysis, a relationship between the weather parameters and the solar irradiance (step 315). As mentioned above, this is preferably achieved by providing the historical measured values (or, the embedded tensor when dense embedding is performed on the historical measured values and on the associated measure times) to an encoder network of a Seq2Seq network (see the encoder network 415 of FIG. 4).

Preferably, the encoder network 415 is a bi-directional encoder network 415, i.e. it comprises two sibling RNN networks: a first RNN network for processing the input sequence as usual, and a second RNN network for processing the same sequence in reverse order (thus, the first and second RNN networks will be referred to as forward and backward RNN networks). Broadly speaking, the forward RNN network uncovers the effects due to some causes occurred in the past, whereas the backward RNN network uncovers the causes of some effects observed in the future. The forward and backward RNN networks are independent from each other, and their respective outputs and final hidden states are typically either summed or concatenated. According to an embodiment of the present invention, the outputs and final hidden states of the forward and backward RNN networks are summed to reduce the number of parameters to train, in fact without reducing the accuracy of the final prediction. Therefore, the result of the encoder network 415 is a single hidden state that sums the final hidden states of the forward and backward RNN networks, and a sequence of output vectors (in the following, output vector sequence), as many as the input sequence length (72 in the example at issue). The output vector sequence is preferably indicative of the relationship between the weather parameters and the solar irradiance. As the output vector sequence results from the historical measured values (and the associated measure times) processed by the encoder network 415, such an output vector sequence will be also referred to as encoded historical measured values—the encoded historical measured values will be assumed to incorporate also the respective (encoded) measure times.

Additionally or alternatively, the encoder network 415 is a "Long Short Term Memory" (LSTM) encoder network or a "Gated Recurrent Unit" (GRU) encoder network. In a preferred embodiment of the present invention, the encoder network 415 is a bi-directional GRU encoder network.

After having determined the relationship between the weather parameters and the solar irradiance (i.e., encoded historical measured values output by the encoder network 415), the forecasting procedure 300 preferably introduces an attention model to the encoded historical measure values (step 320).

Broadly speaking, the attention model is itself a neural network that allows the decoder network to refer back to the input sequence, instead of forcing it to encode all information into one fixed-length vector (as instead is in conventional Seq2Seq networks)—see Dzmitry Bandanau, Kyunghyun Cho, and Yoshua Bengio 2015, *"Neural machine translation by jointly learning to align and translate"*, Proc. of ICLR. Association for Computational Linguistics. Otherwise stated, the attention model allows the Seq2Seq network to access its internal memory (i.e., the outputs of the encoder network 415), such that instead of just using the compressed information of the last hidden state of the encoder network 415, the decoder network learns to "attend" (focus on) the relevant parts of the whole output sequence of the encoder network. Preferably, although not necessarily, the memory access mechanism is soft, which means that the Seq2Seq network retrieves a weighted combination of all memory locations, not a value from a single discrete location. Making the memory access soft has the benefit that the Seq2Seq network can easily be trained end-to-end. Summarizing, the attention model can be implemented as a complementary neural network (hereinafter, attention network) 420 that is able to learn to soft-weight the output sequence of the encoder network 415 and that can be jointly trained end-to-end along with the encoder network 415 and the following decoder network (discussed below).

According to an embodiment of the present invention, the attention network 420 comprises a feed-forward network whose input are the output vector sequence (i.e., the sequence of output vectors—or, equivalently, the encoded historical measured values—from the encoder network 415) and the current hidden state of the decoder network, and whose output is a weighted combination of said output vector sequence (so as to weight the relative importance of each output vector sequence).

Preferably, said weighted combination (i.e., the relative importance of the output vector sequence) depends on the current hidden state of the decoder network. More preferably, said weighted combination is achieved by applying a soft-max function over the output vector sequence. Even more preferably, the soft-max function values are indicative of the probabilities of said output vector sequence, and advantageously form a soft multimodal distribution (i.e. a distribution having multiple modes, thus one or many "peaks"), it meaning that not only a single output vector of the output vector sequence is rigidly considered relevant (for example, by taking the "one" value whilst all other output vectors of output vector sequence take the "zero" value), but that two or more output vectors of the output vector sequences can be relevant.

Back to the figures, the forecasting procedure 300 then comprises, at step 325, retrieving the forecasted values of the weather parameters (preferably, a sequence of 24-hour day-ahead forecasted values of one or more weather variables, and more preferably of the same weather parameters whose historical measured values have been retrieved at step 305), and providing the retrieved forecasted values of the weather parameters (preferably, as discussed below, a dense embedded version thereof) to a decoder network 430 of the Seq2Seq network, together with the encoded historical measured values (or the weighted combination of the encoded historical measured values in case that an attention model is applied), thereby allowing the decoder network 430 to determine forecasted values of the solar irradiance—step 330.

Preferably, the sequence of 24-hour day-ahead forecasts is a tensor whose shape is:
mini-batch-size, i.e. the size of the mini-batch of data;
sequence length, i.e. the sequence of data which in this case is the 24 hour ahead weather forecast; and
feature-size, i.e. the independent variables—contrary to the encoder network 415, the decoder network 430 has not the solar irradiance as independent variable, the solar irradiance being instead the target (in fact the neural network 400 is trained with a L2 loss (mean square error) on the final output layer to predict the true irradiance).

Then, similarly to the above discussion, the categorical values of the categorical variables are transformed into continuous values and concatenated with the continuous values of the continuous variables (preferably, again at the dense embedder 410, as conceptually illustrated in FIG. 3 by arrow connection between step 325 and step 310, and in FIG. 4 by the retrieved forecasted values F of the weather parameters input to the dense embedder 410), to become the input for the decoder network 430.

Notably, the decoder network 430 handles the same variables of the encoder network with the exception of the solar irradiance. In fact, the encoder network 415 is fed with the historical measured values of the solar irradiance, whereas the decoder network 430 output is the forecasted solar irradiance (e.g., for the day ahead).

Preferably, the decoder network 430 is a unidirectional RNN network. Additionally or alternatively, the decoder network 430 is a "Long Short Term Memory" (LSTM) RNN network or a "Gated Recurrent Unit" (GRU) RNN network. In a preferred embodiment of the present invention, the decoder network 430 is a unidirectional GRU RNN network.

Preferably, the hidden state of the decoder network 430 is initialized with the hidden state of the encoder network 415, with the attention network 420 that, as mentioned above, is conditioned on the current hidden state of the decoder network 430—this mutual dependency between the attention network 420 and decoder network 430 allows the neural network 400 to learn very complex probability distributions.

The output of the decoder network 430 is the solar irradiance forecast (denoted by P in the figures), the solar irradiance forecast being for example used by the apparatus 120 (e.g., by exploiting CPU 210 functionalities and/or processing capabilities) to estimate the energy (for example, the electric energy) generated by a solar system (for example, a photovoltaic system).

Therefore, according to the present invention, a weather model is trained with a number of past observations (i.e., the historical measured values of the weather parameters and of solar irradiance), and particularly with the most recent past observations), thereafter during inference the trained weather model is fed with weather day-ahead forecasts (i.e., the forecasts of the weather parameters in the immediate future), so as to receive corresponding day-ahead solar irradiance forecasts which are highly reliable.

Therefore, according to the present invention, day-ahead forecasts are exploited (like a regression problem) and recent past observations are exploited (like an auto-regression problem), with the relative importance/reliability of these two predictors that is preferably combined and weighted (wherein the best combination and weighting is automatically learned by training the neural network).

Naturally, in order to satisfy local and specific requirements, a person skilled in the art may apply to the invention described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

More specifically, the present invention lends itself to be implemented through an equivalent method (by using similar steps, removing some steps being not essential, or adding further optional steps); moreover, the steps may be performed in different order, concurrently or in an interleaved way (at least partly).

In addition, analogous considerations apply if the system has a different structure or comprises equivalent components, or it has other operating features. In any case, any component thereof may be separated into several elements, or two or more components may be combined into a single element; in addition, each component may be replicated for supporting the execution of the corresponding operations in parallel. It should also be noted that any interaction between different components generally does not need to be continuous (unless otherwise indicated), and it may be both direct and indirect through one or more intermediaries.

The invention claimed is:

1. A method for estimating energy generated by a solar system in a predetermined geographic area, the method comprising, at each predetermined time instant:
retrieving measured values of at least one weather parameter and of solar irradiance in said predetermined geographic area, said measured values being related to a first time slot before said predetermined time instant;
performing an auto-regression analysis of the measured values;
estimating, based on said auto-regression analysis, a relationship between the at least one weather parameter and the solar irradiance, wherein said performing and said estimating comprise providing the measured values of the at least one weather parameter and of the solar irradiance to an encoder network of a sequence-to-sequence neural network, to obtain encoded measured values indicative of said relationship between the at least one weather parameter and the solar irradiance;
retrieving forecasted values of said at least one weather parameter in said predetermined geographic area, said forecasted values being forecasted for a second time slot after said predetermined time instant;
performing a regression analysis of said relationship between the at least one weather parameter and the solar irradiance of said forecasted values;
forecasting a solar irradiance in said second time slot based on said regression analysis wherein said forecasting comprises providing said encoded measured values and said forecasted values to a decoder network of the sequence-to-sequence neural network; and
estimating energy generated by the solar system in said second time slot according to the forecasted solar irradiance and at least one solar system parameter.

2. The method according to claim 1, wherein said performing and said estimating comprise:

providing the measured values of at least one weather parameter and of solar irradiance to an encoder network of a sequence-to-sequence neural network, to obtain encoded measured values indicative of said relationship between the at least one weather parameter and the solar irradiance, and providing the encoded measured values to an attention network to obtain a weighted combination of the encoded measured values, and wherein said performing and said forecasting comprise:
providing said weighted combination of the encoded measured values and said forecasted values to a decoder network of the sequence-to-sequence neural network.

3. The method according to claim 1, wherein:
the measured values comprise, for each weather parameter and for the solar irradiance, a plurality of measured values each one related to a respective measure time within said first time slot;
said retrieving comprises retrieving the measured values and the respective measure times; and
said providing the measured values of the at least one weather parameter and of solar irradiance to an encoder network comprises providing the measured values and the respective measure times to the encoder network.

4. The method according to claim 1, wherein at least one of said at least one weather parameter is a categorical variable, each weather parameter other than a categorical variable being a continuous variable, and wherein said providing the measured values of the at least one weather parameter and of solar irradiance to an encoder network comprises:
mapping the measured values of each categorical variable to vectors of numbers in a continuous space,
concatenating the mapped measured values with the measured values of each continuous variable to obtain concatenated measured values of each weather parameter, and
providing said concatenated measured values to the encoder network together with the measured values of solar irradiance.

5. The method according to claim 4, wherein said continuous space is a Euclidean space.

6. The method according to claim 1, wherein said encoder network is a bi-directional recurrent neural network.

7. The method according to claim 1, wherein said encoder network is a "Long Short Term Memory" or a "Gated Recurrent Unit" recurrent neural network.

8. The method according to claim 2, wherein the attention network comprises a feed-forward network adapted to provide said weighted combination of the encoded measured values according to a current hidden state of the decoder network.

9. The method according to claim 1, wherein the decoder network is a unidirectional decoder network.

10. The method according to claim 9, wherein the decoder network is a "Long Short Term Memory" or a "Gated Recurrent Unit" recurrent neural network.

11. The method according to claim 1, wherein said at least one weather parameter comprises at least one among:
textual general weather information;
temperature;
humidity; or
amount of sky occluded by clouds.

12. The method according to claim 1, wherein said solar system is a photovoltaic system, and wherein the energy generated by the solar system is electric energy generated by the photovoltaic system.

13. A system for estimating energy generated by a solar system in a predetermined geographic area, the system comprising:
non-transitory computer readable media having computer-executable modules comprising:
a first module configured to retrieve, at a predetermined time instant, measured values of at least one weather parameter and of solar irradiance in said predetermined geographic area, said measured values being related to a first time slot before said predetermined time instant, and to retrieve forecasted values of said at least one weather parameter in said predetermined geographic area, said forecasted values being forecasted for a second time slot after said predetermined time instant;
a second module configured to estimate, based on an auto-regression analysis of the measured values, a relationship between the at least one weather parameter and the solar irradiance, wherein said second module comprises an encoder network of a sequence-to-sequence neural network, said encoder network providing encoded measured values indicative of said relationship between the at least one weather parameter and the solar irradiance;
a third module configured to forecast a solar irradiance in said second time slot based on a regression analysis of said relationship between the at least one weather parameter and the solar irradiance of said forecasted values, wherein said third module comprises a decoder network of the sequence-to-sequence neural network, the decoder network providing solar irradiance forecasting according to said encoded measured values and said forecasted values; and
a fourth module configured to estimate energy generated by the solar system in said second time slot according to the forecasted solar irradiance and at least one solar system parameter.

14. A system for estimating energy generated by a solar system in a predetermined geographic area, the system comprising:
a processor; and
non-transitory computer readable media having instructions stored thereon, wherein the instructions, when executed by the processor, cause the system to:
retrieve, at a predetermined time instant, measured values of at least one weather parameter and of solar irradiance in said predetermined geographic area, said measured values being related to a first time slot before said predetermined time instant;
retrieve forecasted values of said at least one weather parameter in said predetermined geographic area, said forecasted values being forecasted for a second time slot after said predetermined time instant;
estimate, based on an auto-regression analysis of the measured values, a relationship between the at least one weather parameter and the solar irradiance, wherein said estimating comprises providing the measured values of the at least one weather parameter and of the solar irradiance to an encoder network of a sequence-to-sequence neural network, to obtain encoded measured values indicative of said relationship between the at least one weather parameter and the solar irradiance;

forecast a solar irradiance in said second time slot based on a regression analysis of said relationship between the at least one weather parameter and the solar irradiance of said forecasted values, wherein said forecasting comprises providing said encoded measured values and said forecasted values to a decoder network of the sequence-to-sequence neural network; and estimate energy generated by the solar system in said second time slot according to the forecasted solar irradiance and at least one solar system parameter.

* * * * *